(12) United States Patent
Spurlock et al.

(10) Patent No.: US 7,816,697 B1
(45) Date of Patent: Oct. 19, 2010

(54) SYSTEM AND METHOD FOR MOUNTING AN OPTICAL COMPONENT TO AN INTEGRATED CIRCUIT PACKAGE

(75) Inventors: Brett A. Spurlock, Felton, CA (US); Edward D. Huber, Mountain View, CA (US); Jahja I. Trisnadi, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 85 days.

(21) Appl. No.: 11/710,034

(22) Filed: Feb. 23, 2007

Related U.S. Application Data

(60) Provisional application No. 60/776,498, filed on Feb. 24, 2006.

(51) Int. Cl.
*H01L 33/00* (2010.01)
(52) U.S. Cl. .................. 257/98; 257/99; 257/E33.058; 257/E33.061; 257/E33.067; 257/E33.073
(58) Field of Classification Search .................. 257/98, 257/99, E33.058, E33.061, E33.067, E33.073
See application file for complete search history.

(56) References Cited

U.S. PATENT DOCUMENTS

| | | | |
|---|---|---|---|
| 6,051,848 A | 4/2000 | Webb | |
| 6,252,252 B1 | 6/2001 | Kunii | |
| 6,603,148 B1 | 8/2003 | Sano | |
| 7,227,236 B1 * | 6/2007 | Lee et al. | 257/433 |
| 7,280,288 B2 * | 10/2007 | Loh et al. | 359/726 |
| 7,326,583 B2 * | 2/2008 | Andrews et al. | 438/26 |

* cited by examiner

*Primary Examiner*—Victor A Mandala

(57) ABSTRACT

A packaging structure and method are provided for packaging an optoelectronic device. Generally, the packaging structure includes: (i) an integrated circuit (IC) package to which the optoelectronic device is affixed; (ii) an optical plug mounted to the IC package, the optical plug positioned relative to the optoelectronic device to direct light to or from the optoelectronic device, the optical plug having an interior optical surface closest to the optoelectronic device that does not make physical contact with either the optoelectronic device or the IC package. Preferably, the packaging structure can further include air or an index matching fluid in a gap between the interior optical surface and the optoelectronic device or IC package. More preferably, both the IC package and the optical plug include features to facilitate alignment and mounting of the optical plug to the IC package during assembly. Other embodiments are also disclosed.

16 Claims, 4 Drawing Sheets

SYSTEM AND METHOD FOR MOUNTING AN OPTICAL COMPONENT TO AN INTEGRATED CIRCUIT PACKAGE

CROSS-REFERENCE TO RELATED APPLICATIONS

The present application claims the benefit of priority under 35 U.S.C. 119(e) to U.S. Provisional Patent Application Ser. No. 60/776,498 filed Feb. 24, 2006 entitled Optical System And Method For Mounting An Optical Component To An Integrated Circuit Package To Make Them An Integral Part Of The Package; which application is hereby incorporated by reference.

TECHNICAL FIELD

The present invention relates generally to optoelectronic device fabrication and, more particularly to a packaging structure and packaging method for mounting or attaching an optical component to an integrated circuit package to make it an integral part of the package.

BACKGROUND OF THE INVENTION

Optoelectronic devices have been developed for a diversity of applications using a variety of technologies. By optoelectronic devices it is meant both Micro-Electro-Mechanical System (MEMS) devices, and/or semiconductor devices capable of emitting light, such as Light Emitting Diodes (LEDs) or Vertical Cavity Surface Emitting Laser (VCSELs), and photo-sensitive elements capable of receiving light, such as imaging arrays of photodiodes.

Arrays of photo-sensitive elements or photodiodes and VCSELs are often used in, for example, optical navigation systems. Optical navigation systems, such as an optical computer mouse, trackball or touch pad, are well known for inputting data into and interfacing with personal computers and workstations. Such devices allow rapid relocation of a cursor on a monitor, and are useful in many text, database and graphical programs. A user controls the cursor, for example, by moving the mouse over a surface to move the cursor in a direction and over distance proportional to the movement of the mouse. Alternatively, movement of the hand over a stationary device may be used for the same purpose.

VCSELs and arrays of photodiodes are typically formed on a substrate or wafer, using semiconductor fabrication or processing techniques including, for example, deposition, photolithography, and etching procedures. Individual devices are then divided into separate Integrated Circuits (ICs), commonly referred to as a chip or die.

Conventional packaging uses optics either: (i) molded into the IC package; or (ii) as an external component, fixture, or system, mounted on a common circuit board in a fixed position relative to the IC package.

One problem encountered with the first approach, i.e., molding optics into the IC package, is that the optics are limited to a single, external optical surface. Other problems with this approach include limitations on the size and shape of the optics formed directly into the IC package material.

A problem with the second conventional packaging scheme, i.e., externally mounted optics is packaging size. That is, the optics as an external part greatly increases the size or footprint of the electro-optical system. Another problem is that the multiple discrete, external components greatly increase the complexity of the system. Still another problem is reduced stability and reliability. In particular, the multiple component aspect of external parts reduces the mechanical and optical stability of the system, thereby reducing system reliability and increasing potential sources of failure. Potential sources of failure include, for example, misalignment between optics and the optoelectronic device.

Accordingly, there is a need for a packaging structure and packaging method for mounting or attaching an optical component to an IC package of an optoelectronic device that reduces the overall size and complexity of the electro-optical system while enhancing system stability and reliability, and substantially reducing potential sources of failure.

The present invention provides a solution to these and other problems, and offers further advantages over conventional packaging structures and methods of forming the same.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

Figure 1:
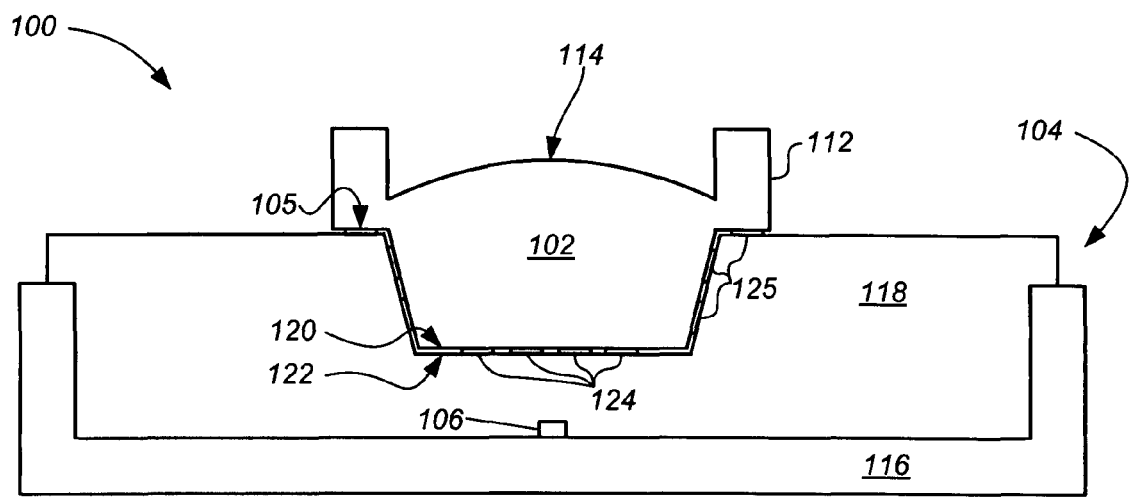
FIG. 1 is cross-sectional side view of an optical plug with an optical surface on an outer surface mounted to a Clear Transfer Mold (CTM) of an Integrated Circuit (IC) packaging structure with an index matching fluid between the optical plug an the CTM according to an embodiment of the present invention.

The present invention is directed generally to a compact packaging structure and packaging method for mounting or attaching an optical component to an Integrated Circuit (IC) package of an optoelectronic device. By optoelectronic device it is meant both a light source, such as a Vertical Cavity Surface Emitting Laser (VCSEL) or a Light Emitting Diode (LED), and a light sensor, such as a photodiode or a photodiode array.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Briefly, the present invention provides an optical sub-system incorporating optical components as integral parts of an IC package of an optoelectronic device. The optical sub-system also provides an opto-mechanical interface between an IC Package and external optics during the assembly process. Generally, the optical sub-system includes an optical component or plug, such as a lens that can be plugged, inserted into or mounted directly to the IC package. Preferably, the IC package includes receiving features that mate with mechanical features in the optical plug to facilitate accurate, stable and reliable mounting of the optical plug to the IC package. More preferably, the receiving features of the IC package and the mechanical features of the optical plug enable the optics to be self-aligned and positioned during assembly thereof, and to become an integral part of the IC package to form a single monolithic structure or component.

As detailed below, the optical plug can be mounted to a variety of different IC packages made using a variety of different technologies. For example, the optical plug can be mounted to a Clear Transfer Mold (CTM) IC package having a window that incorporates integral molded receiving features to align and mate with the optical plug mounting features during assembly. Alternatively or additionally, the optical plug can be used with open cavity IC packages, which have a lid or cover that incorporates receiving features to mate with the optical plug.

Compact, monolithic packaging structures and methods of forming the same in accordance with various embodiments of the present invention will now be described in greater detail with reference to FIGS. 1 through 9. For purposes of clarity, many of the details of semiconductor fabrication in general, and IC packaging in particular that are widely known and are not relevant to the present invention have been omitted from the following description.

A packaging structure for an optoelectronic device according to a first embodiment of the present invention is shown in FIG. 1. Referring to FIG. 1, the packaging structure 100 includes an optical plug 102 inserted into or mounted directly to an IC package, 104 enclosing the optoelectronic device 106. Preferably, the optical plug 102 is manufactured or fabricated using different materials than those used to manufacture the IC package 104, thereby enabling the optical properties or quality of the optical plug to be optimized. Suitable materials for the optical plug 102 include, for example, glass, glass micro-spheres and plastics or thermoplastic polyesters, such as polycarbonate. More preferably, the optical plug 102 is manufactured using different processes and at different temperatures the IC package 104, thereby enabling the conditions under which the IC package is manufactured to also be optimized, and the IC package to be re-worked if necessary.

As noted above, the packaging structure 100 generally further includes or incorporates a variety of different opto-mechanical mounting features depending on the IC packaging used and/or the application of packaged optoelectronic device 106. These features can include, for example, a plug/receptacle feature, a planer flange feature, or a key/keyway feature.

In one embodiment the optical plug 102 and the IC package 104 have Plug/Receptacle mechanical features that include a tapered cylindrical feature (typically located along an optical axis of the optical plug and enclosing a lens element), which serves as the optical plug that is inserted into receptacle receiving features on the IC package. It will be appreciated that this embodiment is particularly useful where it is desired that the position of the optical plug 102 is aligned and fixed in the transverse plane (i.e. in the X and Y directions relative to the surface normal of the packaging structure 100). An embodiment of this version is shown in FIG. 1.

In another embodiment the optical plug 102 and the IC package 104 have planer-flange mechanical features in which the optical plug includes a planar flange 105 perpendicular to an optical axis of the optical plug that contacts pad receiving features on the IC package to set the axial distance for the optical plug optics (focus), or to set the direction of the of the optical axis, that is, it sets and fixes the two orthogonal directional angles of the optical axis (leaving the plug free to rotate or spin about the optical axis).

Figure 2:
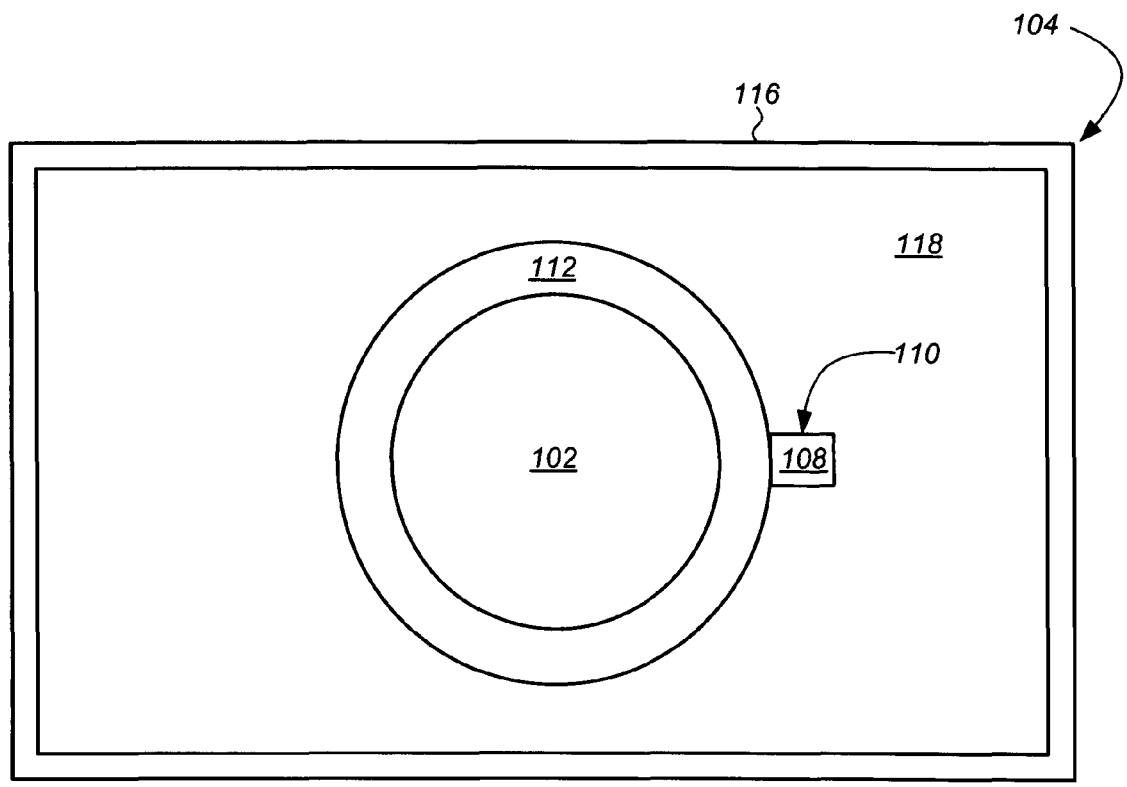
FIG. 2 is planar top view of an optical plug having a key-type feature to set an angular position of the optical plug relative to the IC package according to an embodiment of the present invention.

In another embodiment, shown in FIG. 2, the optical plug 102 and the IC package 104 have a key 108 and keyway 110 features, which can set and lock the spin rotation of the optical plug, around the optical axis. This embodiment is particularly useful for asymmetric or anamorphic packaging configurations.

Optionally, the packaging structure 100 can also include external optical component protection features 112, such as an annular fence that surrounds and extends past external optical component surfaces, to provide protection from external contact and damage. These protection features 112 can be integrally formed with the optical plug 102, as shown in FIG. 1, integrally formed with the IC package 104, or formed separately from both the optical plug and the IC package and affixed thereto using any suitable means. Suitable means for affixing a separate protection feature to the optical plug or the IC package can include an adhesive or mechanical attachment features, such as threading 113 (shown in FIG. 3) or a snap-ring (shown in FIG. 8 and described below). In some preferred embodiments, the protection features 112 can be further adapted or configured to facilitate attachment of the packaging structure 100 to other mechanical and/or optical devices or components in a system in which the packaged optoelectronic device 106 is used. For example, the protection features 112 can be configured to receive an optical fiber (not shown).

The optical plug 102 generally includes an outer or exterior optical surface 114 adapted to direct light to or from the optoelectronic device 106. Preferably, the exterior optical surface 114 is or includes an optically active surface. By optically active surface it is meant an optical surface that is curved or powered surface, or while substantially flat, is angled relative to a direction of propagation of light or a plane of the optoelectronic device 106 (a prismatic surface) to shift a direction of an optical axis of light directed to or from the device. In particular, the exterior optical surface 114 can be a curved or powered surface shaped to form a surface that is convex, concave, spherical, aspherical, axially symmetric, axially asymmetric, diffractive, micro-lens array, a non-powered, flat surface, an angled, prismatic, or a combination thereof. For example, the exterior optical surface 114 can include both a curved and an angled or tilted surface to form both a lens and a prismatic surface.

The IC package 104 generally includes a substrate 116 to which the optoelectronic device 106 is mounted, and having a lead-frame (not shown) through which the device is electrically coupled to external circuitry through pins, leads or pads. In the embodiment shown, the IC package 104 is a CTM IC package that further includes a CTM material 118 covering and encapsulating the device 106. Optionally, the optoelectronic device 106 can be part of a multi-chip-module, in which the IC package 104 encloses additional IC chips, semiconductor elements or devices (not shown).

Preferably, as in the embodiment shown, the optical plug 102 and the CTM material 118 of the IC package 104 are configured to provide an optical interface wherein an interior surface 120 of the optical plug is optically coupled or contacted to an upper surface 122 of the CTM material. More preferably, optical contacting between the optical plug 102 and the surface 122 of the CTM material 118 is accomplished using an index matching substance or material 124 distinct from that of the optical plug 102 and the CTM material 118, but having optical properties, i.e., indices of refraction and reflection, between or similar to both. Suitable index matching materials 124 include, for example, fluids, such as an oil or a silicone, for example polydimethylsiloxane, polymers or an adhesive. In the embodiment shown in FIG. 1, the index matching material 124 is a bonding agent or adhesive, which advantageously also serves the further function of fixing the optical plug 102 to the IC package 104. Alternatively or additionally, the optical plug 102 may be fixed to the IC package 104 by a non-index matching adhesive 125 that is outside of the path through or along which light is propagated to or from the optoelectronic device 106. It will be appreciated that this non-index matching adhesive 125 need not be transparent, and can be any commercially available adhesive suitable for bonding the material of the optical plug 102 to the material of the IC package 104.

Also in the embodiment shown, the surfaces 120, 122, at the optical interface between the optical plug 102 and the CTM material 118 of the IC Package 104 are flat (non-powered) surfaces substantially parallel to each other and to a plane of the optoelectronic device 106. This embodiment enables the optical plug 102 and IC package 106 to be treated as a single optical element when all the materials are precisely index matched.

Figure 3:
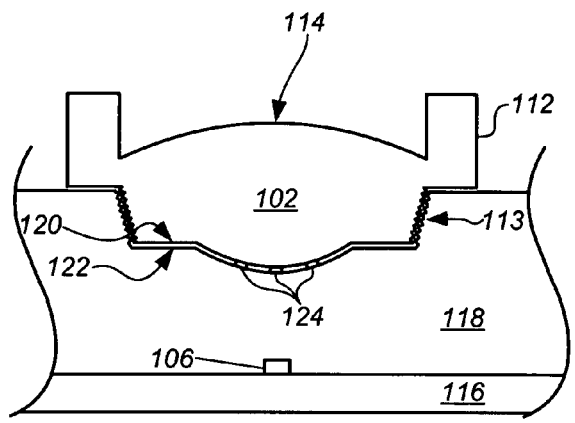
FIGS. 3 and 4 are detailed cross-sectional side views of the optical plug and CTM of FIG. 1 showing detailed views of curved and angled inner surfaces, respectively with an index matching fluid at the optical interface between the optical plug and the CTM according to other embodiments of the present invention.
Figure 4:
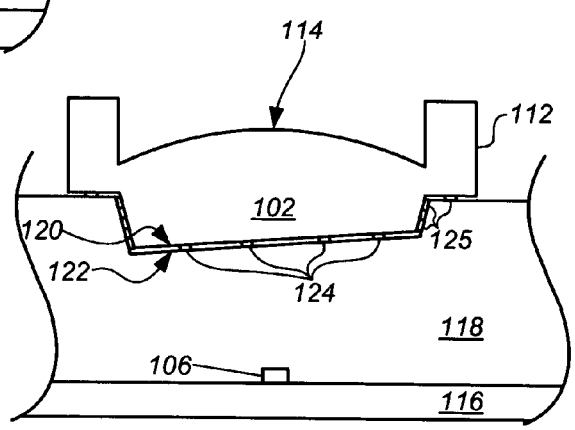

In other embodiments, when powered (i.e., curved) or angled (i.e., prismatic) surfaces are used, or if there are differences between the index of refraction, or chromatic dispersion between the materials, the optical plug 104 and IC package 106 can be treated as a doublet type optical element. Examples of some of these embodiments are shown in FIGS. 3 and 4, which show detailed views of curved and angled surfaces, respectively at the optical interface between the optical plug 102 and the CTM material 118.

Figure 5:
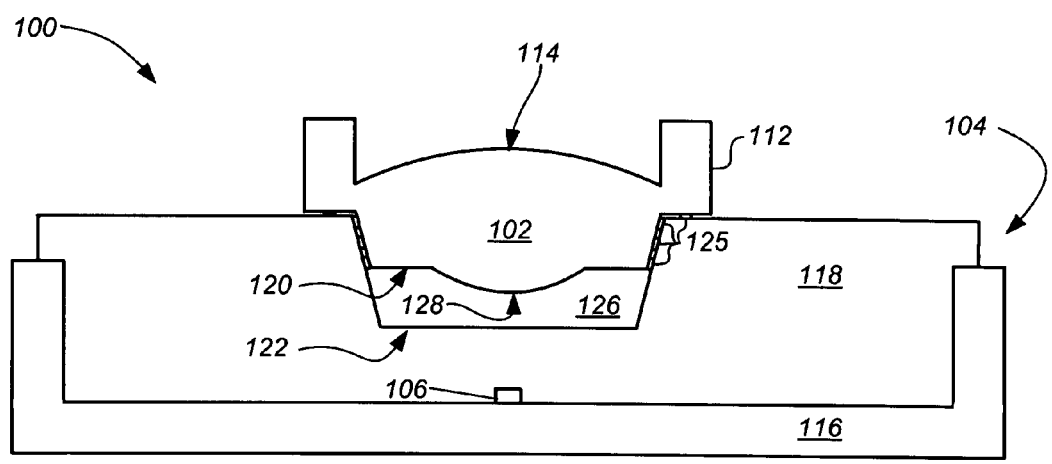
FIG. 5 is cross-sectional side view of an optical plug mounted to a CTM of an IC packaging structure and having an air-gap between the optical plug and CTM according to another embodiment of the present invention.
Figure 6:
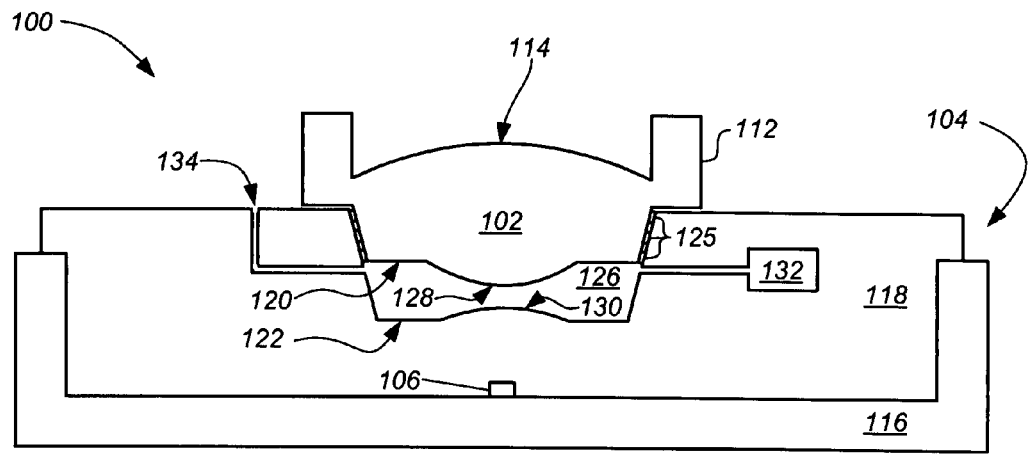
FIG. 6 is cross-sectional side view of an optical plug mounted to a CTM of an IC packaging structure in which the CTM includes an optically active surface on the CTM as well as the optical plug according to yet another embodiment of the present invention.

Alternatively, the optical plug 102 and the IC package 104 can be configured such that the optical interface includes a large gap or an air-gap 126, between the interior surface 120 of the optical plug and the upper surface 122 of the CTM material 118 as shown in FIGS. 5 and 6.

Referring to FIG. 5, in this approach the optical surface 120 of the optical plug 102 does not make physical or optical contact with the CTM material 118 of the IC package 104, the upper surface 122 or the optoelectronic device 106. This approach provides for the condition where the optical surfaces 114, 120, of the optical plug 102 and the upper surface 122 of CTM material 118 or the IC package 104 can be treated independently for optical design and application purposes. In particular, in the embodiment shown in FIG. 5, the interior optical surface 120 of the optical plug 102 is an optically active or powered surface including a curved surface molded therein to form a convex lens 128, while the upper surface 122 of the CTM material 118 is a substantially flat, non-powered and non-prismatic surface. Although shown as having a single convex lens 128, it will be appreciated that as with the exterior optical surface 114 of the optical plug 102 the interior optical surface 120 can be shaped to form a curved, convex, concave, spherical, aspherical, axially symmetric, axially asymmetric, diffractive, micro-lens array, a non-powered, flat surface, an angled, prismatic surface, or a combination of surfaces. For example, the exterior optical surface 114 can include both a curved and an angled or tilted surface to form both a lens and a prismatic surface.

As with the embodiments described above, the optical plug 102 can be attached to the CTM material 118 of the IC package 104 using mechanical means or an adhesive 125 as shown.

In yet another embodiment, shown in FIG. 6, the CTM material 118 may also be configured to include an optically active upper surface 122. Again, in the embodiment shown the upper surface 122 includes a single convex lens 130. However, it will be appreciated that as with the exterior and the interior optical surfaces 114, 120, of the optical plug 102 the upper surface 122 of the CTM material 118 can be shaped to form a curved, convex, concave, spherical, aspherical, axially symmetric, axially asymmetric, diffractive, micro-lens array, a non-powered, flat surface, an angled, prismatic surface, or a combination of surfaces. For example, the exterior optical surface 114 can include both a curved and an angled or tilted surface to form both a lens and a prismatic surface.

As with the embodiments described above, the optical plug 102 can be attached to the CTM material 118 of the IC package 104 using mechanical means or an adhesive 125 as shown.

In another aspect or embodiment of the present invention, the air-gap 126 can be substantially filled with an index matching fluid (not shown), and the packaging structure 100 can further include an index matching fluid control means to control excess index matching fluid introduced to the gap during assembly. The control means can include, for example, a reservoir 132 in the optical plug 102 or IC package 104 to provide a pocket volume to receive excess material during assembly, or a fill and/or vent hole 134 to which the fluid can be applied or where excess fluid can escape during assembly.

Figure 7:
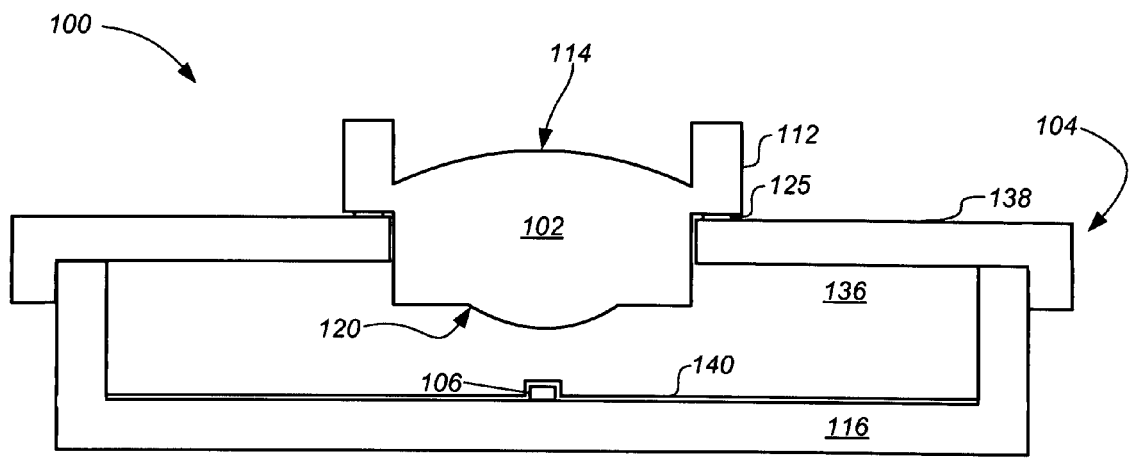
FIG. 7 is cross-sectional side view of an optical plug mounted to a lid of an open cavity IC packaging structure and having an air-gap between the optical plug and an optoelectronic device enclosed therein according to still another embodiment of the present invention.
Figure 8:
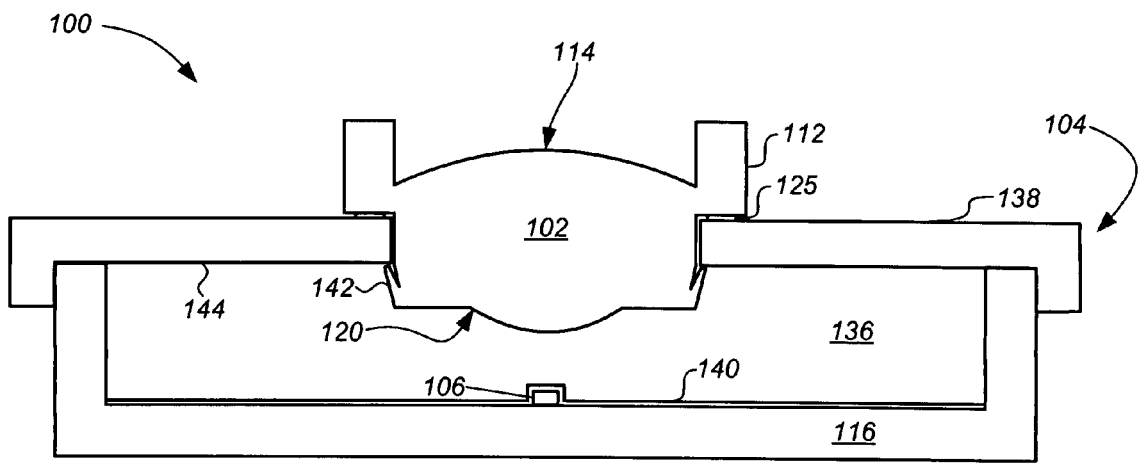
FIG. 8 is cross-sectional side view of an optical plug mounted to a lid of an open cavity IC packaging structure by a snap or clipping attachment feature according to still another embodiment of the present invention.

In the embodiment shown in FIG. 7 the IC package 104 is an open cavity IC package that includes a substrate 116 having a cavity 136 formed therein in which the optoelectronic device 106 is mounted, and a lid or cover 138 that incorporates bubble optic receiving features or receiving features to mate with mechanical features on the optical plug 102. Generally, the IC package 104 further includes a lead frame (not shown) through which the optoelectronic device 106 is electrically coupled to external circuitry. Optionally or preferably, the IC package 104 can further include a thin layer of encapsulant material 140 overlying the optoelectronic device 106 on the substrate 116 substrate 116 to electrically and/or mechanically insulate or isolate the device. Generally, the encapsulant material 140 can be any suitable dielectric material having the desired electrical and mechanical insulating properties, and being transparent at the thickness of the layer to one or more of the wavelengths of light received or transmitted by the optoelectronic device 106 in operation.

As described above in connection with the CTM IC packages of FIGS. 1 through 6, the optical plug 102 includes exterior and interior optical surfaces 114, 120. Preferably, at least one of the exterior and interior optical surfaces 114, 120 of the optical plug 102 is or includes an optically active surface. Suitable optically active surfaces can include curved, convex, concave, spherical, aspherical, axially symmetric, axially asymmetric, diffractive, micro-lens array, non-powered, flat surface or angled prismatic surfaces, or a combination thereof.

As also described above, the packaging structure 100 can further include external optical component protection features 112 to provide protection from external contact and damage, and/or to facilitate attachment to other mechanical and/or optical devices or components.

The optical plug 102 can be fixed to the cover 138 of the IC package 104 by a bonding agent or adhesive 125, as shown in FIG. 7, or by a mechanical attachment feature, such as a snap, clip or threads. In one embodiment, shown in FIG. 8, the optical plug 102 is fixed to the cover 138 of the IC package 104 by a snap attachment feature which captures and locks the optical plug to the IC Package. In the embodiment, shown in FIG. 8 the snap attachment feature includes snap-ring having a number of fingers 142, that lock against an inner surface 144 of the cover 138 following insertion there through.

Figure 9:
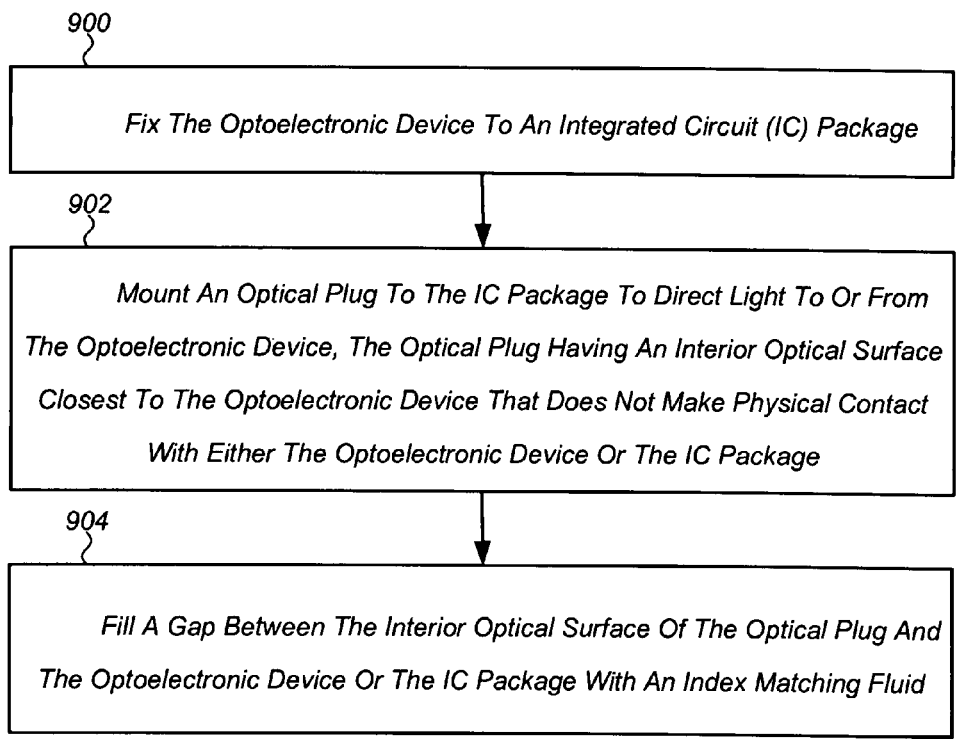
FIG. 9 is flow chart of a method for packaging an optoelectronic device according to an embodiment of the present invention.

Methods for packaging an optoelectronic device in accordance with the present invention will now be described in greater detail with reference to the flowchart of FIG. 9. Referring to FIG. 9, generally the method of the present invention begins with fixing the optoelectronic device to the substrate of an IC package (step 900). Next, an optical plug or optical plug is mounted to the IC package to direct light to or from the optoelectronic device, the optical plug having an interior optical surface closest to the optoelectronic device that does not make physical contact with either the optoelectronic device or the IC package (step 902). Finally, in a preferred embodiment the gap between the interior optical surface of the optical plug and the optoelectronic device or the IC package is filled with an index matching fluid (step 904).

The advantages of the packaging structure and method of the present invention over previous or conventional structures and methods include: (i) enables separate manufacturing of the optical components or plug using different materials than those used to manufacture the IC package, thereby enabling the quality of the optical plug to be optimized; (ii) enables manufacturing of the optical components or plug and the IC package using different processes at different temperatures; (iii) enables optical components including lenses or prisms to be integrated into a single-monolithic IC package structure; (iv) compact form factor in which the optical components and the IC package are configured to minimize the overall package size; (v) low profile in which 'plugging' the optics into the IC package lowers the profile of the component package; (vi) integral alignment features in which the optical plug includes mounting and alignment features that provide for self-alignment and registration to IC package components during assembly that control all six degrees of freedom (including position in X, Y, and Z; and angle in Alpha, Beta, and Gamma); and (vii) self-locking retention mechanism in which structures provide for automatic self activating retention features that provide for secure and stable mounting of the optical plug to the IC package during assembly.

In addition, by incorporating the optics into the IC package as a plugged-in component offers several advantages over optics that are formed as part of the IC package or its window material. These advantages include: (i) reducing IC package fabrication tolerance requirements and complexity; (ii) facilitating implementation of more complex optics, if required; and (iii) facilitating tighter fabrication tolerances optics, if required Moreover, incorporating the optics into the IC package as a plugged-in component also offers several advantages over optics that are mounted externally. These advantages include: (i) reduced assembly complexity; (ii) increased component stability, reliability and survivability; and (iii) reduced overall size requirements for the optics.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A packaging structure for an optoelectronic device comprising:
    an Integrated Circuit (IC) package to which the optoelectronic device is affixed;
    an optical plug mounted to the IC package to direct light to or from the optoelectronic device, the optical plug having an interior optical surface closest to the optoelectronic device; and
    wherein the IC package comprises an optically active surface between the optoelectronic device and the interior optical surface of the optical plug.

2. A packaging structure according to claim 1, wherein the optical plug further comprises an exterior optical surface, and wherein at least one of the exterior optical surface or the interior optical surface of the optical plug comprises an optically active surface.

3. A packaging structure according to claim 2, wherein the optically active surface of the optical plug comprises a surface selected from the group consisting of curved, convex, concave, spherical, aspherical, planar, flat, angled, axially symmetric, axially asymmetric, diffractive, and micro-lens array surfaces.

4. A packaging structure according to claim 2, wherein the optically active surface of the optical plug comprises a prismatic surface, and wherein the optical plug forms a prism to shift a direction of an optical axis of light directed to or from the optoelectronic device through the optical plug.

5. A packaging structure according to claim 1, further comprising an index matching fluid in a gap between the interior optical surface of the optical plug and the optically active surface of the IC package, the index matching fluid comprising an index of refraction between those of the optical plug and IC package.

6. A packaging structure according to claim 5, wherein the index matching fluid further comprises an adhesive to fix the optical plug to the IC package.

7. A packaging structure according to claim 1, wherein the optically active surface of the IC package does not physically contact the optical plug.

8. A packaging structure according to claim 1, wherein the optoelectronic device is encapsulated within the IC package.

9. A packaging structure according to claim 1, further comprising mechanical attachment features on at least one of the IC package or the optical plug to attach the optical plug to the IC package.

10. A packaging structure according to claim 2, wherein the optical plug further comprises a protective feature that extends past the exterior optical surface of the optical plug.

11. A packaging structure according to claim 1, further comprising:
   mechanical features on at least one of the IC package or the optical plug by which the optical plug is attached to the IC package, wherein the mechanical features further comprise a tapered cylindrical surface, and wherein the optoelectronic device is encapsulated in the IC package.

12. A packaging structure according to claim 11, wherein the mechanical features comprise threading.

13. A packaging structure for an optoelectronic device sensitive to light comprising:
   an Integrated Circuit (IC) package in which the optoelectronic device is encapsulated, the IC package transparent to at least one wavelength of light to which the optoelectronic device is sensitive;
   an optical plug mounted to the IC package to direct light to the optoelectronic device, the optical plug including an interior optical surface closest to the optoelectronic device and an exterior optical surface, the IC package comprising an optical surface in a path of light between the optoelectronic device and the optical plug; and
   an index matching fluid in a gap between the interior optical surface of the optical plug and the optical surface of the IC package, the index matching fluid comprising an index of refraction between those of the optical plug and IC package.

14. A packaging structure according to claim 13, wherein at least one of the interior optical surface or the exterior optical surface of the optical plug comprises an optically active surface.

15. A packaging structure according to claim 14, wherein the optically active surface of the optical plug comprises a surface selected from the group consisting of curved, convex, concave, spherical, aspherical, planar, flat, angled, axially symmetric, axially asymmetric, diffractive, and micro-lens array surfaces.

16. A packaging structure according to claim 13, wherein the optical surface of the IC Package comprises an optically active surface selected from the group consisting of curved, convex, concave, spherical, aspherical, planar, flat, angled, axially symmetric, axially asymmetric, diffractive, and micro-lens array surfaces.

* * * * *